United States Patent [19]

Talgam et al.

[11] Patent Number: 4,996,641
[45] Date of Patent: Feb. 26, 1991

[54] DIAGNOSTIC MODE FOR A CACHE

[75] Inventors: Yoav Talgam, Tel-Aviv, Israel; Paul A. Reed, Austin, Tex.; Elie Haddad, Austin, Tex.; James A. Klingshirn, Austin, Tex.

[73] Assignee: Motorola, Inc., Schaumburg, Ill.

[21] Appl. No.: 181,856

[22] Filed: Apr. 15, 1988

[51] Int. Cl.$^5$ ............................ G06F 11/10; G06F 11/22
[52] U.S. Cl. .................................... 364/200; 364/900
[58] Field of Search ... 364/200 MS File, 900 MS File; 371/15.1, 16.1, 18

[56] References Cited

U.S. PATENT DOCUMENTS

| | | | |
|---|---|---|---|
| 4,089,063 | 5/1978 | Takezono et al. | 364/200 |
| 4,168,541 | 9/1979 | DeKarske | 364/200 |
| 4,190,885 | 2/1980 | Joyce et al. | 364/200 |
| 4,315,313 | 2/1982 | Armstrong et al. | 364/200 |
| 4,357,656 | 11/1982 | Saltz et al. | 364/200 |
| 4,493,026 | 1/1985 | Olnowich | 364/200 |
| 4,569,048 | 2/1986 | Sargent | 364/200 |
| 4,575,792 | 3/1986 | Keeley | 364/200 |
| 4,641,305 | 2/1987 | Joyce et al. | 371/16.1 |
| 4,667,288 | 5/1987 | Keeley et al. | 364/200 |
| 4,740,969 | 4/1988 | Fremont | 371/15.1 |
| 4,792,917 | 12/1988 | Takamatsu et al. | 364/900 |
| 4,797,814 | 1/1989 | Brenza | 364/200 |
| 4,882,673 | 11/1989 | Witt | 364/200 |

*Primary Examiner*—Michael P. Fleming
*Assistant Examiner*—C. Shin
*Attorney, Agent, or Firm*—James L. Clingan, Jr.

[57] ABSTRACT

A cache has an address bus for receiving requests for data from a processor and a data bus for providing the requested data to the processor. As part of the mechanism for determining if there is a hit in the cache, the cache has TAG locations for storing TAG addresses. The hit signal is not generated unless a TAG address corresponds to the address received on the address bus. Associated with each TAG location are valid bits, disable bits, and LRU bits. The requested data is contained in data locations in the cache. Each data location has a corresponding TAG location. The disable bits can be set under the control of the processor for the case where a data location is defective. Additionally, in various diagnostic modes, the TAG locations, the valid bits, the LRU bits, and the data locations are directly accessible via the data bus.

6 Claims, 3 Drawing Sheets

FIG.1 —PRIOR ART—

DIAGNOSTIC MODE FOR A CACHE

FIELD OF THE INVENTION

The invention relates to semiconductor caches, and more particularly, to caches for use in conjunction with a processor.

BACKGROUND OF THE INVENTION

The use of caches in conjunction with processors has been shown to be very effective in speeding up the rate that instructions are executed. The cache is a memory which is relatively small compared to main memory but which is very fast. The cache is used to provide very fast access to the instructions and/or data which are frequently used. There may or may not be separate caches for instructions (or code) and data. Whether the information is actually instructions or data, the information can be referred to as simply data. There has developed circuitry for keeping track of data which is contained in the cache. The common approach has been to use what is commonly known as TAGs as part of the cache to aid in identifying a request for data or an instruction which is contained in the cache. The processor submits a request for data or an instruction in the form of an address. The TAG is used to determine if the address generated by the processor is one for which the cache has the needed data. The TAG has TAG locations for storing TAG addresses for which information is contained in the cache. The address generated by the processor is compared to the TAG addresses. If the processor-generated address is also a TAG address then the cache does have the requested data. When this occurs it is generally considered a "hit," and a hit signal is generated. There have been discovered solutions to some of the problems inherent in a TAG. One of the problems is at "start-up" when none of the information in the cache and none of the addresses in the TAG have been set. A solution to this problem has been the use of a valid bit which is set when information is stored in the cache which corresponds to a TAG address. If the valid bit is not set, then the hit signal is suppressed for that generated address. The setting of the valid bit is set by the cache when information is written into the cache. As the processor processes data and instructions, the most used address locations may change. Thus, the cache may be full of valid information, but that information may not be the information which is being frequently used. A technique for keeping track of the least recently used TAG locations has been developed to keep the information in the cache not only valid but also current. Least-recently-used (LRU) logic has been developed for keeping track of the least recently used TAG locations. When there is a miss in the cache, there is then an access to main memory. When the main memory returns the information to the processor, the cache also stores this information and the corresponding TAG address in a TAG location. The LRU logic determines which TAG location is the one that should be replaced by the most recent address which missed in the cache. The replaced TAG location is the one which the LRU logic determined was the least recently used TAG address.

A cache may have, in one extreme, completely fixed addresses. If the TAG addresses are fixed, then there is no need to keep track of the least recently used TAG address because the TAG addresses are fixed. The information which corresponds to the TAG address is the only thing which can be updated. The determination of a hit on the TAG address is very simple because the TAG addresses are hard wired. In another extreme, any TAG location can have any address generated by the processor. In such a case, the determination of a TAG address hit requires reading all of the stored TAG addresses and performing a comparison of each of them with the address generated by the processor. This type of cache is known as a fully associative cache. There is a compromise approach in which certain of the TAG locations can have limited variability. There may be, for example, sets of four TAG locations in which each of the four TAG locations within a set has some bits in common and a some that are variable. The common address bits (which comprise what is known as the "index") are thus hard-wired so that in response to an address generated by the processor, one set of four TAG locations is accessed. In such a case, the address generated by the processor can be considered to have an index portion and a TAG portion. The four TAG addresses present in the four TAG locations accessed by the index portion of the processor-generated address are read and compared to the TAG portion of the generated address. If one of the TAG addresses in the accessed TAG locations and the TAG portion of the generated address are the same, then there is a TAG hit. If the data which corresponds to the hit TAG location is valid, then the hit signal is generated and the information which corresponds to the hit TAG location is provided to the processor. Another similar approach to the set-associative approach, is for there to be a single TAG location for the index portion of the generated address. In such a case, only a single TAG address is compared to the TAG portion of the generated address.

There are other problems with caches. They are generally hard to test because the TAG addresses, which are critical to the operation of the cache, are not actually output from the cache. Thus, if the circuitry in the cache which stores the TAG addresses is to be tested, it must be tested indirectly. The TAG addresses themselves are not actually read but must be verified by inference. This is also true of the valid bits and the LRU bits. Even to read data from the cache, there must first be a hit with the address so even data locations are read by inference. Another characteristic of caches is that if a single bit in the cache becomes defective, the whole cache, as is the case in a typical integrated circuit memory, is no longer usable. The whole cache or the whole integrated circuit must either be replaced or mapped out of the system by software.

SUMMARY OF THE INVENTION

Accordingly, it is an object of the present invention to provide an improved cache.

It is another object of the present invention to provide a cache with improved diagnostic capabilities.

It is yet another object of the invention to provide a cache with improved disabling capability.

In carrying out these and other objects of the invention, there is provided, in one form, a cache having an address bus for receiving addresses from a processor requesting data, and a data bus for providing requested data to the processor. The cache includes a TAG memory, a data memory, a TAG memory decoder, a register, and a control-bit port. The TAG memory has a plurality of valid bits, a plurality of disable bits, and a plurality of TAG locations for storing a plurality of TAG addresses. Each TAG location has a valid bit of the plurality of valid bits and a disable bit of the plurality of disable bits associated therewith. The data memory has a plurality of storage locations for storing data, wherein said stored data may be invalid and wherein said storage locations may be defective. Each storage location corresponds to a TAG location of the plurality of TAG locations, a valid bit of the plurality of valid bits for indicating if data stored in the storage location is invalid, and a disable bit of the plurality of disable bits for indicating if the storage location is defective. The TAG memory decoder selects a first subset of TAG locations and disable bits which correspond thereto in response to a first portion of the address provided onto the address bus. The register stores information received from said data bus and selects the first subset of TAG locations. The control-bit port couples the disable bits which correspond to the first subset of TAG locations to the data bus.

DETAILED DESCRIPTION OF THE INVENTION

Figure 1:
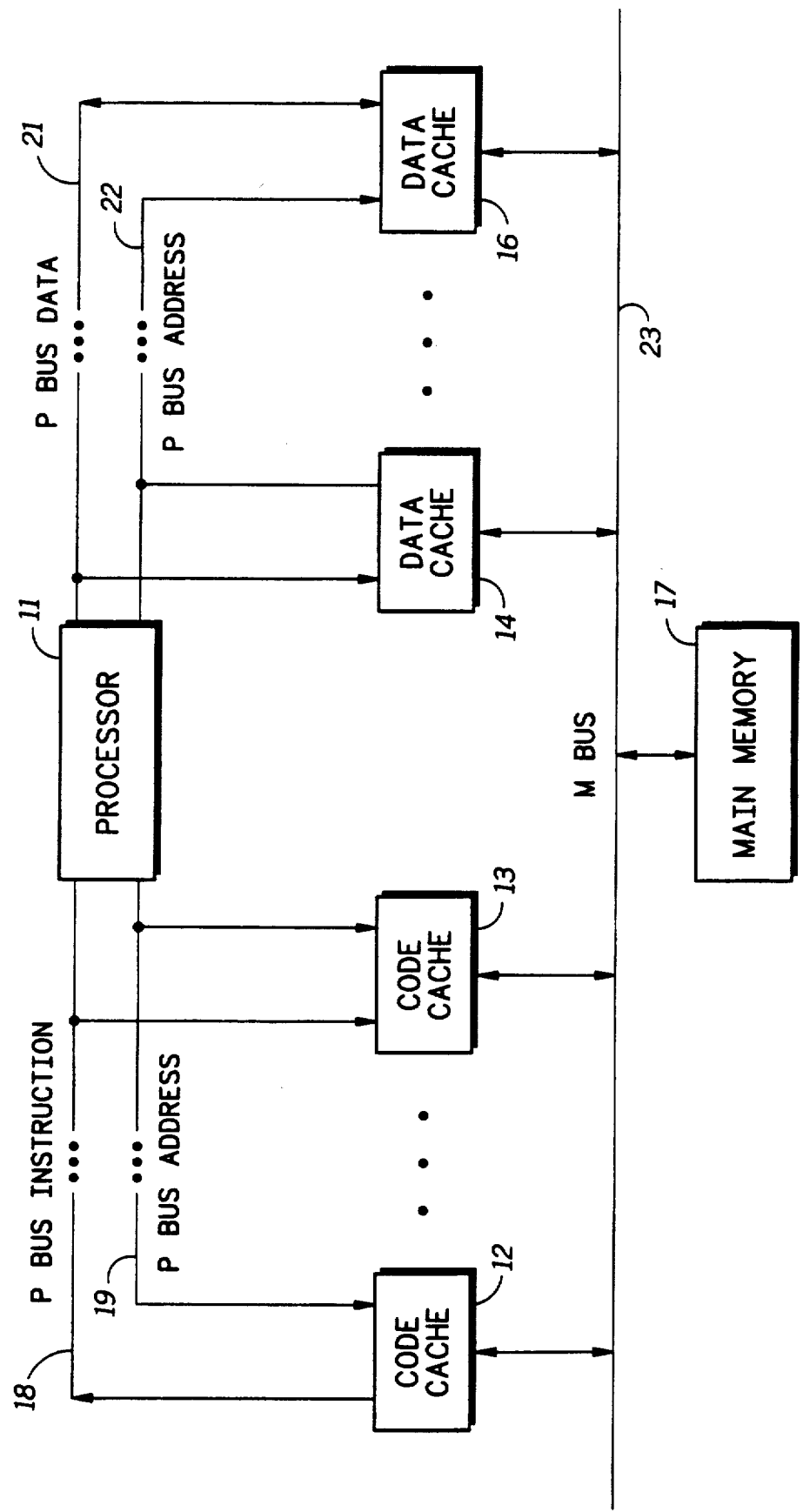
FIG. 1 is a block diagram of a computing system using caches according to a manner of the prior art.

Prior to the invention itself being described, prior art FIGS. 1 and 2 will be described. Shown in FIG. 1 is a computing system 10 comprised of a processor 11, a code cache 12, a code cache, 13, a data cache 14, and a data cache 16, and a main memory 17. Processor 11 is a coupled to code caches 12 and 13 by a P bus 18 for carrying instructions and a P bus 19 for carrying addresses of instructions. Computing system 10 can have many more code caches coupled to P buses 18 and 19. Data caches 14 and 16 are coupled to processor 11 by a P bus 21 for carrying data and a P bus 22 for carrying addresses. As in the case of code caches 12 and 13, there may be many other data caches coupled to processor 11. All of the caches 12, 13, 14, and 16 are coupled to M bus which is multiplexed. M bus 23 is also coupled to main memory 17. P buses 18, 19, 21, and 22 and M bus are all normally one word wide. A word may be, for example, 32 bits.

In operation processor 11 executes instructions using data. Main memory 17 contains the necessary instructions and data. The caches contain some instructions and some data, particularly the often used instructions and data. Processor 11 requests an instruction by sending an address out on P bus 19 and receives back the requested instruction on P bus 18. If one of the code caches, such as cache 12 or 13, have the requested instruction, the processor receives the instruction back in a single cycle from the code cache which has the instruction. This is known as a hit. Each of the code caches has a particular identification code so that it knows when it is being addressed by processor 11. If the instruction is not present in one of the caches, the M bus is used to obtain the instruction from main memory 17. This is known as a miss. The address for the instruction is provided onto M bus 23. Main memory 17 responds by sending back the information, which in the present case is an instruction, which is residing in the addressed location in main memory 17. A designated one of the code caches responds to the presence of the instruction on the M bus by providing the instruction to processor 11 via P bus 18. A designated code cache also stores the instruction after a miss.

The operation is much the same when processor 11 makes a data request. Processor 11 provides an address onto P bus 22. If one of the data caches has the requested data, a hit, that data cache provides the requested data onto P bus 21 where it is received by processor 11. If the requested data is not in one of the data caches, a miss, then the data must be obtained from main memory 17 in the same manner as for obtaining an instruction. A designated data cache stores the data. Each of the data caches has a particular identification code so that it knows when it is being addressed by processor 11. The data and code caches may have identical circuitry but are used somewhat differently. One difference in use is that processor 11 can write data into a designated data cache. A typical computing system does not provide for the processor to write instructions into a code cache. The caches themselves, or some other special operating block, may contain a memory management unit to translate between logical addresses and physical addresses. Thus the address generated by processor 11 for a data request may not be the same address which is provided onto M bus 23 to obtain the data in the case of a cache miss. The address provided on M bus 23 would correspond to but not be the same as the address on P bus 22.

Figure 2:
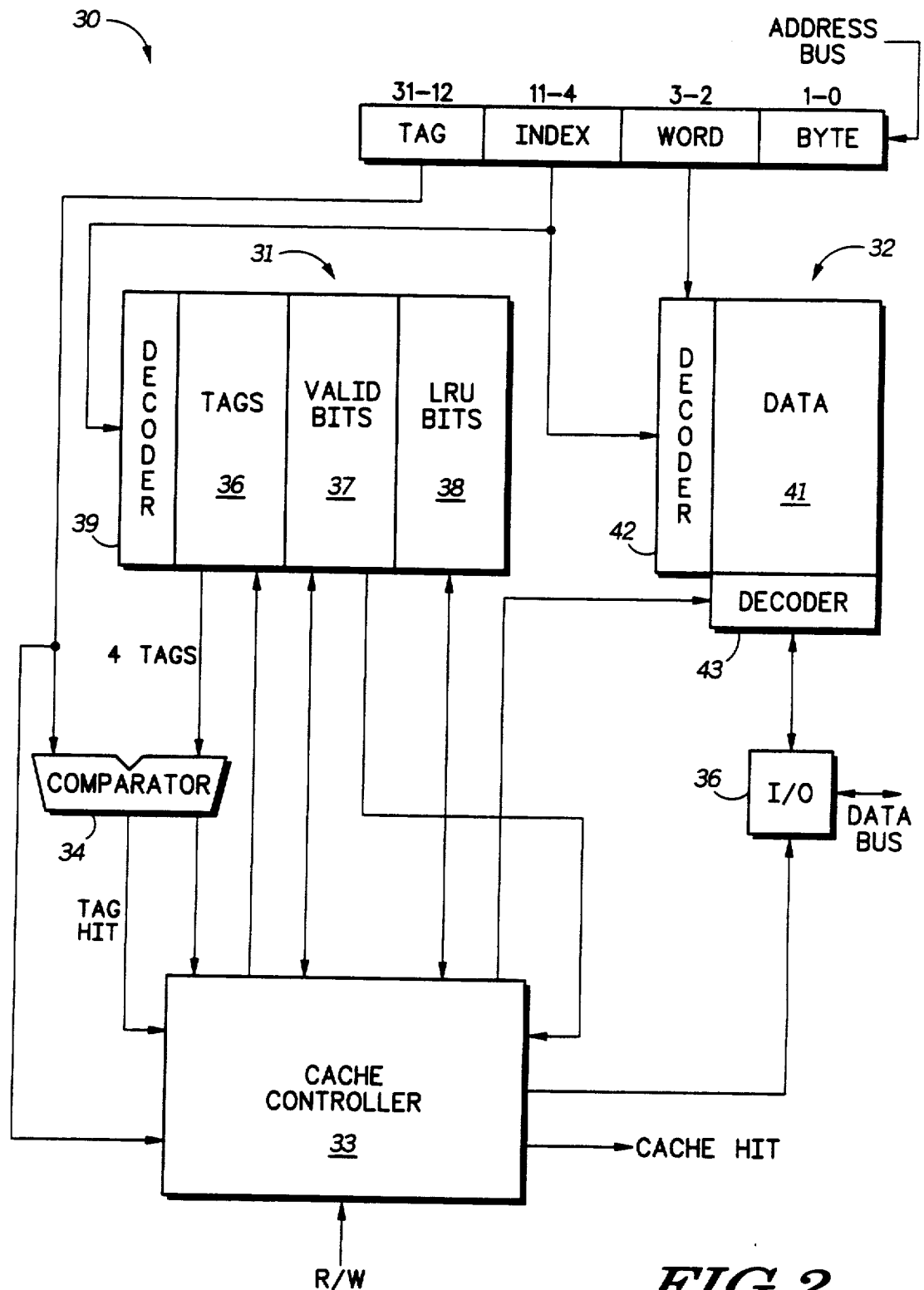
FIG. 2 is block diagram of a cache according to the prior art for use in the computing system of FIG. 1.

Shown in FIG. 2 is a cache 30 which could be used as one of caches 12, 13, 14, or 16. Cache 30 includes a TAG memory 31, a data memory 32, a cache controller 33, a comparator 34, and an I/O gate 35. TAG memory 31 comprises a TAG portion 36, a valid bits portion 37, an LRU portion 38, and a decoder 39. Data memory 32 comprises a data portion 41, a decoder 42, and a decoder 43. Cache 30 receives a 32 bit address A31–A0, from an address bus. The 32-bit address is divided, functionally, into a 20-bit TAG (A31–A12), an 8-bit index (A11–A4), a 2-bit word select (A3–A2), and a 2-bit byte select (A1–A0). Address A31–A0 received on the address bus shown in FIG. 2 may be translated from a logical address to a physical address. Thus the address bus shown in FIG. 2 may not be exactly the same as that of P bus 19 or P bus 22 because there may be an interposed memory management unit for performing the logical address to physical address translation. There would remain a correspondence between the address on P bus 19 or 22 and the address on the address bus shown in FIG. 2 but that correspondence might not be identity correspondence.

In operation decoder 39 selects four TAG locations in TAG portion 36 in response to the index. Each TAG location in TAG portion 36 has 20 bits which comprise the TAG address. Comparator 34 compares the TAG address in the four selected TAG locations to the TAG of address A31–A0 which are the 20 high order bits A31–A12. If one the TAG addresses in the four selected TAG locations is the same as A31–A12, comparator 34 provides a TAG hit signal and information as to which TAG location was hit to cache controller 33. Associated with each TAG location are four 32-bit word locations in data memory 32. Decoder 42 receives the index as well as the 2-bit word select. The 2-bit word select determines which word within the four words associated with the TAG location is the word requested by address A31–A0. This narrows the word selection to the words associated with four TAG locations. The TAG location is determined by comparator 34. The TAG location selection, if there is a TAG hit, is sent to decoder 43 from comparator 34. The word location in data portion 41 which is selected by the index, the word select, and the TAG comparison is coupled to I/O 35. Cache controller 33 also receives the valid bits associated with the four selected TAG locations and the information provided by comparator 34 as which TAG location was hit. The valid bits associated with the four selected TAG locations indicate which if any of the TAG locations have data stored in data memory 32 associated therewith which is valid. If the data in memory 32 which is associated with the hit TAG location is valid, cache controller communicates that to I/O 36. For a read operation, which is indicated by cache controller 33 receiving a read/write signal R/W in a first logic state, I/O 35 outputs onto the data bus the data present in the selected data location. If, on the other hand, cache 30 is in the write mode, I/O 36 writes the data present on the data bus into the selected data location in data memory 32. Cache controller 33 also updates the LRU bits to reflect the fact that the hit TAG location is now the most recently used TAG location.

In the case where comparator 34 determines that there is a miss in the cache, one of the TAG locations of the four TAG locations selected by the index is loaded with TAG A31-A12 and the corresponding four data locations are loaded with data. In the case of a write when there is a hit, the loading of the hit TAG location and the selected data location of the four corresponding data locations occurs in one cycle. The primary difference between a hit and a miss in a write is that a TAG location is loaded with the new TAG address and all four of the corresponding data locations must be loaded with data. The TAG location is selected based on the status of the LRU bits so that the data locations which are written correspond to the TAG location which was least recently used instead of the TAG location which was hit. The LRU bits associated with the four TAG locations selected by the index indicate which of the TAG locations was least recently used. Cache controller 33 then provides the TAG location information to decoder 43 so that the corresponding data location is coupled to I/O 36 which drives the data which is present on the data bus into the selected word location. In the case where the address is for requested data which is not present which causes a miss in the cache, the data must be obtained from main memory. This can take quite a number of cycles before the data is provided on the data bus. The request for the data from main memory is made via a multiplexed bus such as M bus 23 shown in FIG. 1. Address A31-A0 is output on the multiplexed bus. Either the address bus or the data bus can be coupled to the multiplexed bus. When the data is brought back from main memory via the multiplexed bus, it is provided onto the data bus where it is sent back to a processor such as processor 11 in FIG. 1 and is stored in the data memory 32.

Figure 3:
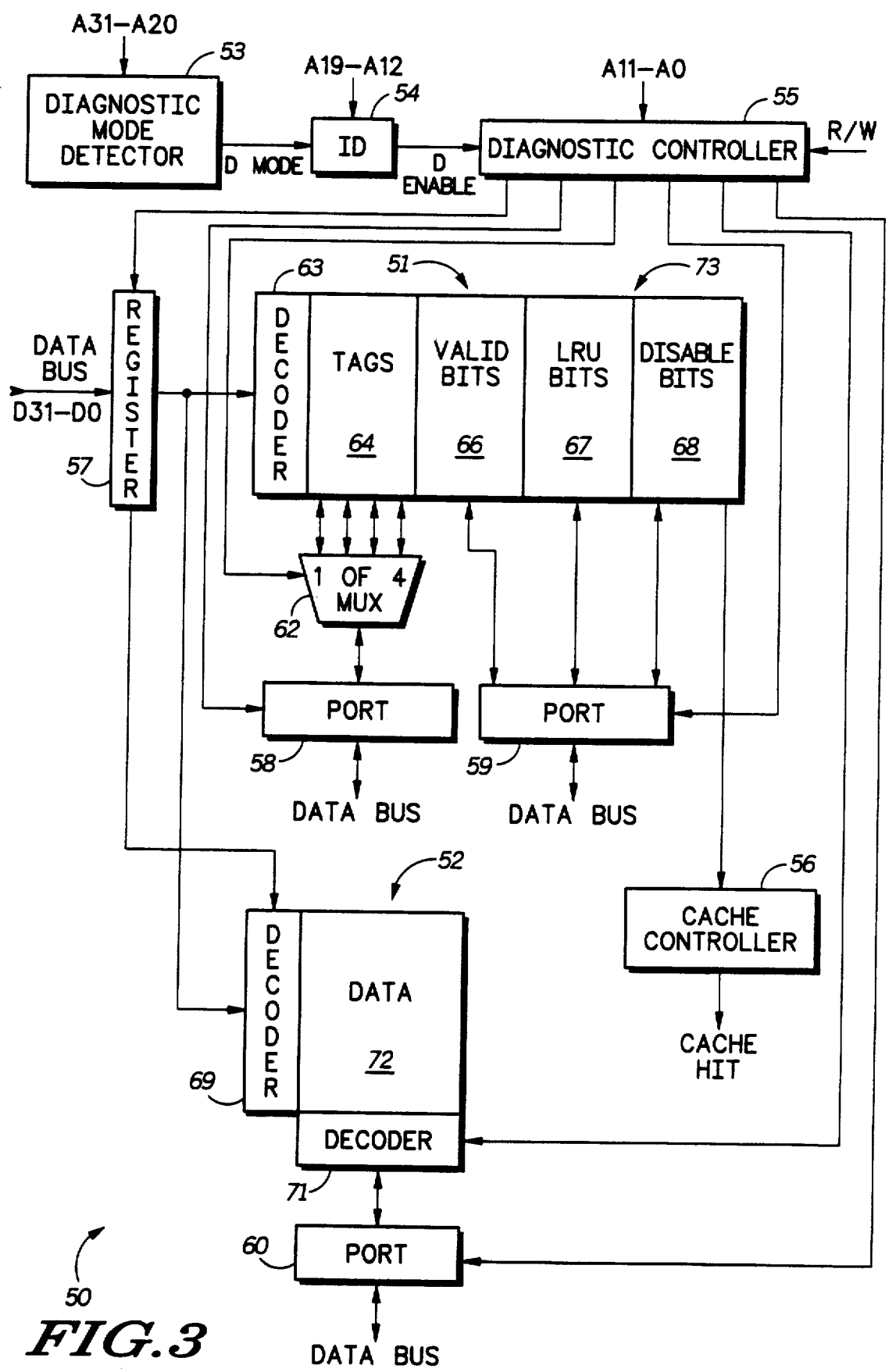
FIG. 3 is a block diagram of a cache having additional characteristics to those shown in FIG. 2 according to a preferred embodiment of the invention.

Shown in FIG. 3 is a cache 50 according to a preferred embodiment of the invention. Cache 50 includes all of the features of a cache such as cache 30 shown in FIG. 2 and caches 12, 13, 14, and 16 shown in FIG. 1 as well as additional features. For simplicity not all of the features and connections shown in FIGS. 1 and 2 are shown in cache 50 of FIG. 3. Cache 50 includes a cache memory 51, a data memory 52, a diagnostic mode detector 53, an identification detector 54, a diagnostic controller 55, a cache controller 56, a register 57, a port 58, a port 59, a port 60, and a multiplexer 62. Cache memory 51 comprises a decoder 63, a TAG portion 64, a valid bits portion 66, an LRU bits portion 67, and a disable bits portion 68. Data memory 52 comprises a decoder 69, a decoder 71, and a data portion 72. In normal operation, when addresses are received as requests for reading or writing data, cache 50 operates the same as cache 30. Cache controller 56, decoder 63, TAG portion 64, valid bits portion 66, LRU bits portion 67, decoder 69, decoder 71, and data portion 72 of cache 50 are analogous to cache controller 33, decoder 39, TAG portion 36, valid bits portion 37, LRU bits portion 38, decoder 42, decoder 43, and data portion 41, respectively, of cache 30. Cache 50 has a diagnostic mode which offers advantages over caches of the prior art.

To enter the diagnostic mode, addresses A31-A20 on the address bus must match a predetermined code, and addresses A19-A12 on the address bus must match the identification code of cache 50. Diagnostic mode detector 53 detects if signals A31-A20 are the predetermined code, for example all ones, and provides a diagnostic mode signal D to identification detector 54. Identification detector 54 detects if signals A19-A12 match the identification code of cache 50 and if signal D has been received from diagnostic mode detector 53, identification detector asserts a diagnostic enable signal DE to diagnostic controller 55. In response to receiving signal DE, diagnostic controller 55 interprets signals A11-A0 to determine which, if any, diagnostic mode is to be entered. The diagnostic modes provide for reading and writing into and out of TAG portion 64, data portion 72, and valid, LRU, and disable bits portions 66, 67, and 68, respectively. Valid, LRU, and disable bits portions 66, 67, and 68 collectively comprise a control bits portion 73. Port 58 is coupled between the data bus and multiplexer 62. Multiplexer 62 is coupled between port 58 and TAG portion 64. Port 58 and multiplexer 62 are used for reading out of and writing into TAG portion 64. Port 59 is coupled between control bits portion 73 and the data bus. Port 59 is used for reading out of and writing into control bits portion 73. Port 60 is coupled between the data bus and data memory 52 and is used for reading out of and writing into data memory 52.

The first step, after it has been determined that cache 50 is in the diagnostic mode as indicated by the assertion of signal DE, is to write into register 57 signals which are analogous to address signals A31-A0. The command to write into register 57 is made by address signals A11-A0. When the command to write into register 57 has been received by diagnostic controller 55, diagnostic controller 55 enables register 57. When register 57 is enabled, it stores the signals, D31-D0, which are present on the data bus. This takes one cycle to perform. TAG locations are written into or read from by enabling port 58, performing a one of four selection with multiplexer 62, and enabling register 57 to output the index to decoder 63. Register 57 provides signals analogous to address signals A31-A0. The signals stored in register 57 are received from the data bus. The signals provided to decoder 63 are D11-D4 which act as the index for TAG memory 51. Thus the information stored in register 57 as D11-D4 cause four TAG locations to be selected. The particular code of signals A11-A0 determines which TAG is selected. The read/write signal R/W determines if the TAG location outputs its contents onto the data bus or if the TAG location is written with the contents of the data bus. For the control bits portion 73, all of the valid bits, LRU bits, and disable bits associated with all four TAG locations selected by the index are available for reading or writing. When the combination of signals A11-A0 selects the mode for the control bits, register 57 again is directed to provide the index to decoder 63 which selects the four TAGs and also the valid bits, LRU bits, and disable bits which are associated with the four selected TAG locations. Signal R/W determines if the control bits are output onto the data bus or set by the signals on the data bus. This not only allows for improved testing capability but also allows for direct control of the initial conditions of the control bits.

The disable bits provide a function not previously available. There are four disable bits per index, one for each selected TAG location. This disable bit can be set under the control of the computing system of which cache 50 forms a part. When the disable bit is set, the TAG location associated therewith is considered disabled. This is achieved by causing the cache controller 20 to treat the received request as a miss. The cache controller reads the state of the disable bit associated with the hit TAG location and responds accordingly. This allows for a cache which has or develops bad data locations to continue to provide functionality. In a sense the utility of a cache is based on the idea that there is a relatively small number of addresses which are used a large percentage of the time. To lose four data locations, as in the present case where there are four data locations per TAG location, is not likely to result in any noticeable deterioration in the utility of the cache. This is particularly true because there still remains three good TAG locations for the index of the single defective TAG location. This may be useful in salvaging devices which have only a few defects as well as for providing the ability to map out a small percentage of a cache device instead the whole device. This may be particularly useful in systems which have a small number of caches or especially only one. This would provide continued operation while a replacement is found instead of having to shut down the whole system.

To set a single disable bit during normal operation would first require reading the contents of the control bits of the selected four TAG locations because a write writes all of the control bits of the four selected TAG locations. Thus, in order not to disturb the control bits of the unaffected TAG locations, it would be necessary to know what the status of the control bits was before writing. The means for setting a disable bit associated with a specific TAG is made available in cache 50. The disable bit associated with a TAG location is different from what was available in the prior art. The valid bits are used in association with a specific TAG location to indicate that the data location(s) associated with the TAG location has not been written with valid data. The utility for having disable bits in addition to valid bits has not been previously recognized. The disable bit provides additional information to that previously provided in caches.

Data portion 72 can also be read and written in much the same fashion as the TAG locations. Decoder 69 not only requires the index information but also the information supplied by address signals A3-A2 which define the word within the four words associated with a specific TAG location. Register 57 supplies signals D3-D2 in addition to the index. There is still needed the information which narrows the selection to the TAG location. There are four combinations of A11-A0 used for selecting which of the four TAG locations is the selected location. The TAG selection is communicated to decoder 71 from diagnostic controller 55. Thus, four unique combinations of address signals A11-A4 result in access between the data bus and data portion 72. Signal R/W is used by diagnostic controller 55 to determine whether to have port 60 write from the data bus into the word location or to have the contents of the word location output onto the data bus.

The number of diagnostic commands described for cache 50 is ten. There is the command to load register 57 with the contents of the data bus. There are the four commands for access between the four selected TAG locations and the data bus. There is the command for access between the control bits and the data bus. There are the four commands for access between the four data locations associated with the four selected TAG locations and the data bus. These ten commands are delivered to cache 50 on the address bus by ten unique combinations of signals A11-A0 while holding A31-A20 at the diagnostic mode code and holding A19-A12 at the identification code of cache 50. The possible number of unique combinations of signals A11-A0 is 4096.

As shown in FIG. 1, there is a multiplexed bus which is multiplexed between addresses and data. A cache of the type shown in FIG. 1, on which cache 50 is an improvement, can receive addresses from either the address bus or the multiplexed bus and receive or provide data on either the data bus or the multiplexed bus. Thus a diagnostic mode of cache 50 can be entered via the multiplexed bus. Diagnostic controller 55, ID detector 54, and diagnostic mode detector 53 would receive address signals A31-A0 from the multiplexed bus instead of the address bus. Similarly, register 57 would receive signals D31-D0 from the multiplexed bus instead of the data bus. This is particularly useful for the case where a plurality of caches like cache 50 are actually installed in a computing system such as system 10 in FIG. 1. In such a case one or more of the caches would be for storing instructions. The processor could control an instruction cache via the multiplexed bus for performing the functions available in a diagnostic mode. Techniques for manipulating an instruction cache from the multiplexed bus via a data cache are known in the art so cache 50 in use as an instruction cache could be subjected to the functions available from a diagnostic mode via the multiplexed bus.

We claim:

1. A cache having an address bus for receiving addresses from a processor requesting data, and a data bus for providing requested data to the processor, comprising:

a TAG memory, coupled to the address bus, having a plurality of valid bits, a plurality of disable bits, and a plurality of TAG locations for storing a plurality of TAG addresses, each TAG location having a valid bit of the plurality of valid bits and a disable bit of the plurality of disable bits associated therewith;

a data memory, coupled to the data bus, having a plurality of storage locations for storing data, wherein said stored data may be invalid and wherein said storage locations may be defective, each storage location corresponding to a TAG location of the plurality of TAG locations, a valid bit of the plurality of valid bits for indicating if data stored in the storage location is invalid, and a disable bit of the plurality of disable bits for indicating if the storage location is defective;

TAG memory decoder means for selecting a first subset of TAG locations and disable bits which correspond thereto in response to a first portion of the address provided onto the address bus;

register means. coupled to the data bus and the TAG memory decoder, for storing information received from said data bus and selecting the first subset of TAG locations; and control-bit port means, coupled to the disable bits and the data bus, for coupling the disable bits which correspond to the first subset of TAG locations to the data bus.

2. The cache of claim 1 further comprising:

TAG port means, coupled to the TAG memory and the data bus, for coupling a selected TAG location of the first subset of TAG locations to the data bus.

3. The cache of claim 2, wherein the TAG memory means is further characterized as selecting the valid bits which correspond to the first subset of TAG locations, and the control-bit port means is further characterized as coupling the valid bits which correspond to the first subset of TAG locations to the data bus.

4. A cache having an address bus for receiving addresses from a processor requesting data, and a data bus for providing requested data to the processor, comprising:

a TAG memory, coupled to the address bus, having a plurality of valid bits and a plurality of TAG locations for storing a plurality of TAG addresses, each TAG location having a valid bit of the plurality of valid bits associated therewith;

a data memory, coupled to the data bus, having a plurality of storage locations for storing data, wherein said stored data may be invalid, each storage location corresponding to a TAG location of the plurality of TAG locations and a valid bit of the plurality of valid bits for indicating if data stored in the storage location is invalid;

detection means, coupled to the address bus, for detecting if the cache is to enter a diagnostic mode;

control means, coupled to the data bus and the detection means, for coupling a selected TAG location to the data bus in response to entering the diagnostic mode, wherein the control means comprises:

TAG memory decoder means, coupled to the address bus, for selecting a first subset of TAG locations and valid bits which correspond thereto in response to a first portion of the address provided onto the address bus;

register means, coupled to the data bus and the TAG memory decoder, for storing information which corresponds to the first portion of the address and providing said information which corresponds to the first portion of the address to the TAG memory decoder means, whereby the information stored in the register selects a second subset of TAG locations which correspond to the first subset of TAG locations; and TAG port means, coupled to the TAG memory, the detection means, and the data bus, for coupling a selected TAG location of the first subset of TAG locations.

5. The cache of claim 4 wherein the detection means is further characterized as selecting the selected TAG location of the first subset of TAG locations.

6. A cache having an address bus for receiving addresses from a processor requesting data, and a data bus for providing requested data to the processor, comprising:

a TAG memory, coupled to the address bus, having a plurality of control bits and a plurality of TAG locations for storing a plurality of TAG addresses, each TAG location having a set of control bits of the plurality of control bits associated therewith, said TAG locations being divided into a plurality of subsets;

a data memory, coupled to the data bus, having a plurality of storage locations for storing data, each storage location corresponding to a TAG location of the plurality of TAG locations;

TAG memory decoder means, coupled to the address bus, for selecting a particular subset of TAG locations and the sets of control bits which correspond thereto as determined by a first portion of the address provided onto the address bus;

register means, coupled to the data bus and the TAG memory decoder means, for storing information received from the data bus which corresponds to the first portion of the address and providing said information which corresponds to the first portion of the address to the TAG memory decoder means, whereby the information stored in the register means selects a particular subset of TAG locations and the subsets of control bits which correspond thereto;

detection means, coupled to the address bus, for detecting if the cache is to enter a diagnostic mode;

control-bits port means, coupled to the TAG memory, the detection means, and the data bus, for coupling the subsets of control bits which correspond to the subset of TAG locations selected by the register means to the data bus in response to the detection means detecting that the cache is to enter the diagnostic mode.

* * * * *